US009183945B2

(12) United States Patent
Avila et al.

(10) Patent No.: US 9,183,945 B2
(45) Date of Patent: Nov. 10, 2015

(54) SYSTEMS AND METHODS TO AVOID FALSE VERIFY AND FALSE READ

(71) Applicant: SanDisk Technologies Inc., Plano, TX (US)

(72) Inventors: Chris Nga Yee Avila, Saratoga, CA (US); Yingda Dong, San Jose, CA (US); Man Lung Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 170 days.

(21) Appl. No.: 13/801,655

(22) Filed: Mar. 13, 2013

(65) Prior Publication Data

US 2014/0153333 A1    Jun. 5, 2014

Related U.S. Application Data

(60) Provisional application No. 61/732,031, filed on Nov. 30, 2012.

(51) Int. Cl.
G11C 11/34      (2006.01)
G11C 16/04      (2006.01)
G11C 16/34      (2006.01)

(52) U.S. Cl.
CPC .................................. G11C 16/3445 (2013.01)

(58) Field of Classification Search
CPC ........ G11C 16/14; G11C 16/10; G11C 16/16; G11C 16/26; G11C 16/3418; G11C 16/06; G11C 16/30; G11C 11/5635; G11C 16/04; G11C 16/0416; G11C 5/14
See application file for complete search history.

(56) References Cited

U.S. PATENT DOCUMENTS

| 5,070,032 | A  | 12/1991 | Yuan et al.    |
|-----------|----|---------|----------------|
| 5,095,344 | A  | 3/1992  | Harari         |
| 5,313,421 | A  | 5/1994  | Guterman et al.|
| 5,315,541 | A  | 5/1994  | Harari et al.  |
| 5,343,063 | A  | 8/1994  | Yuan et al.    |
| 5,570,315 | A  | 10/1996 | Tanaka et al.  |
| 5,661,053 | A  | 8/1997  | Yuan           |
| 5,768,192 | A  | 6/1998  | Eitan          |
| 5,903,495 | A  | 5/1999  | Takeuchi et al.|
| 6,009,014 | A  | 12/1999 | Hollmer et al. |
| 6,011,725 | A  | 1/2000  | Eitan          |
| 6,046,935 | A  | 4/2000  | Takeuchi et al.|
| 6,222,762 | B1 | 4/2001  | Guterman et al.|

(Continued)

FOREIGN PATENT DOCUMENTS

| KR | 20080048301    | 6/2008 |
| WO | WO 2008106778  | 9/2008 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

Primary Examiner — Hien Nguyen
(74) Attorney, Agent, or Firm — Davis Wright Tremaine LLP

(57) ABSTRACT

In a nonvolatile NAND memory array, a NAND block may be falsely determined to be in an erased condition because of the effect of unwritten cells prior to the erase operation. Such cells may be programmed with dummy data prior to erase, or parameters used for a verify operation may be modified to compensate for such cells. Read operations may be similarly modified to compensate for unwritten cells.

10 Claims, 12 Drawing Sheets

(56) References Cited

U.S. PATENT DOCUMENTS

| | | |
|---|---|---|
| 6,314,027 B1 | 11/2001 | Choi |
| 8,787,088 B2 * | 7/2014 | Dutta et al. ............. 365/185.11 |
| 2005/0041515 A1 | 2/2005 | Futatsuyama et al. |
| 2006/0239077 A1 | 10/2006 | Park et al. |
| 2007/0047327 A1 * | 3/2007 | Goda et al. .............. 365/185.29 |
| 2007/0171728 A1 | 7/2007 | Cho |
| 2009/0279356 A1 | 11/2009 | Hashimoto et al. |
| 2009/0296475 A1 * | 12/2009 | Hemink et al. .......... 365/185.17 |
| 2011/0085385 A1 | 4/2011 | Park et al. |
| 2012/0220088 A1 | 8/2012 | Alsmeier |
| 2014/0029351 A1 * | 1/2014 | Mu et al. .................. 365/185.22 |

OTHER PUBLICATIONS

Technical Search Report, Patent Examiner Erik Westin, Jan. 10, 2013, 8 pages.

* cited by examiner

Programming into four states represented by a 2-bit code

SYSTEMS AND METHODS TO AVOID FALSE VERIFY AND FALSE READ

CROSS-REFERENCE TO RELATED APPLICATIONS

This application claims the benefit of Provisional Patent Application No. 61/732,031, filed on Nov. 30, 2012, which is hereby incorporated by reference in its entirety.

BACKGROUND

This application relates to the operation of re-programmable non-volatile memory systems such as semiconductor flash memory systems which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Examples of the present invention relate to systems and methods to avoid false verification that a portion of a memory is in an erased condition, and to avoid false reading of a memory cell state. Dummy data may be programmed to fill a block, or to fill it to a sufficient level to overcome effects of unwritten cells. Alternatively, different erase, and/or erase verify parameters may be used to compensate for unwritten cells (e.g. cells that are unwritten as a result of sub-block erase). Similarly, different read parameters may be used to compensate for unwritten cells in a block.

An example of a method of performing an adaptive erase verification during erase of a block in a NAND memory, includes: determining an amount of unwritten space remaining in the block; if the amount of unwritten space is less than a predetermined amount then performing erase verification using a default set of verification parameters; and if the amount of unwritten space exceeds the predetermined amount then performing erase verification using a modified set of verification parameters that is different to the default set of erase parameters.

The modified set of verification parameters may be selected from a plurality of sets of modified verification parameters according to the amount of unwritten space. The amount of unwritten space may be determined from a write pointer. The write pointer may be maintained by a memory controller that is connected to the NAND memory. The amount of unwritten space may be determined from a binary search of memory cells of the block. The binary search may be performed by logic circuits that are on the same integrated circuit chip as the NAND memory.

An example of a method of performing an adaptive read of a portion of data in a block in a NAND memory includes: determining an amount of unwritten space remaining in the block; if the amount of unwritten space is less than a predetermined amount then performing the read of the portion of data using a first set of read parameters; and if the amount of unwritten space exceeds the predetermined amount then performing the read of the portion of data using a second set of read parameters that is different to the first set of read parameters.

The second set of read parameters may be selected from a plurality of sets of read parameters according to the amount of unwritten space. Prior to determining the amount of unwritten space remaining in the block, an initial read of the portion of data and Error Correction Code (ECC) analysis of the portion of data may be performed that indicates that the portion of data is uncorrectable. The initial read may be performed using a default set of read parameters that is different to the first set of read parameters and the second set of read parameters. The amount of unwritten space remaining in the block may be determined on-chip by a binary search of word lines of the NAND memory. The amount of unwritten space remaining in the block may be determined from a write pointer maintained by a memory controller.

An example of a method of operating a NAND memory includes: identifying a block as being in condition for an erase operation; determining whether a number of unwritten memory cells in the block exceeds a predetermined number; subsequently, if the number of unwritten memory cells in the block exceeds the predetermined number, performing an unverified write operation that raises threshold voltages of unwritten memory cells from an unwritten state; and subsequently performing the erase operation.

The determination may be made based on a write pointer that is maintained by a memory controller, the NAND memory located on a first integrated circuit chip and the memory controller located on a second integrated circuit chip. The determination may be made based on a binary search of rows of memory cells in the block that may be performed by peripheral circuits on the same integrated circuit chip as the NAND memory. The unverified write operation may raise threshold voltages of the unwritten memory cells to a threshold voltage level corresponding to written data. The threshold voltages of all unwritten memory cells in the block may be raised by the unverified write operation. The threshold voltages of only a subset of all unwritten memory cells in the block may be raised by the unverified write operation, the subset including a sufficient number of cells to reduce the number of unwritten memory cells in the block below the predetermined number when the unverified write is performed on the subset alone.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
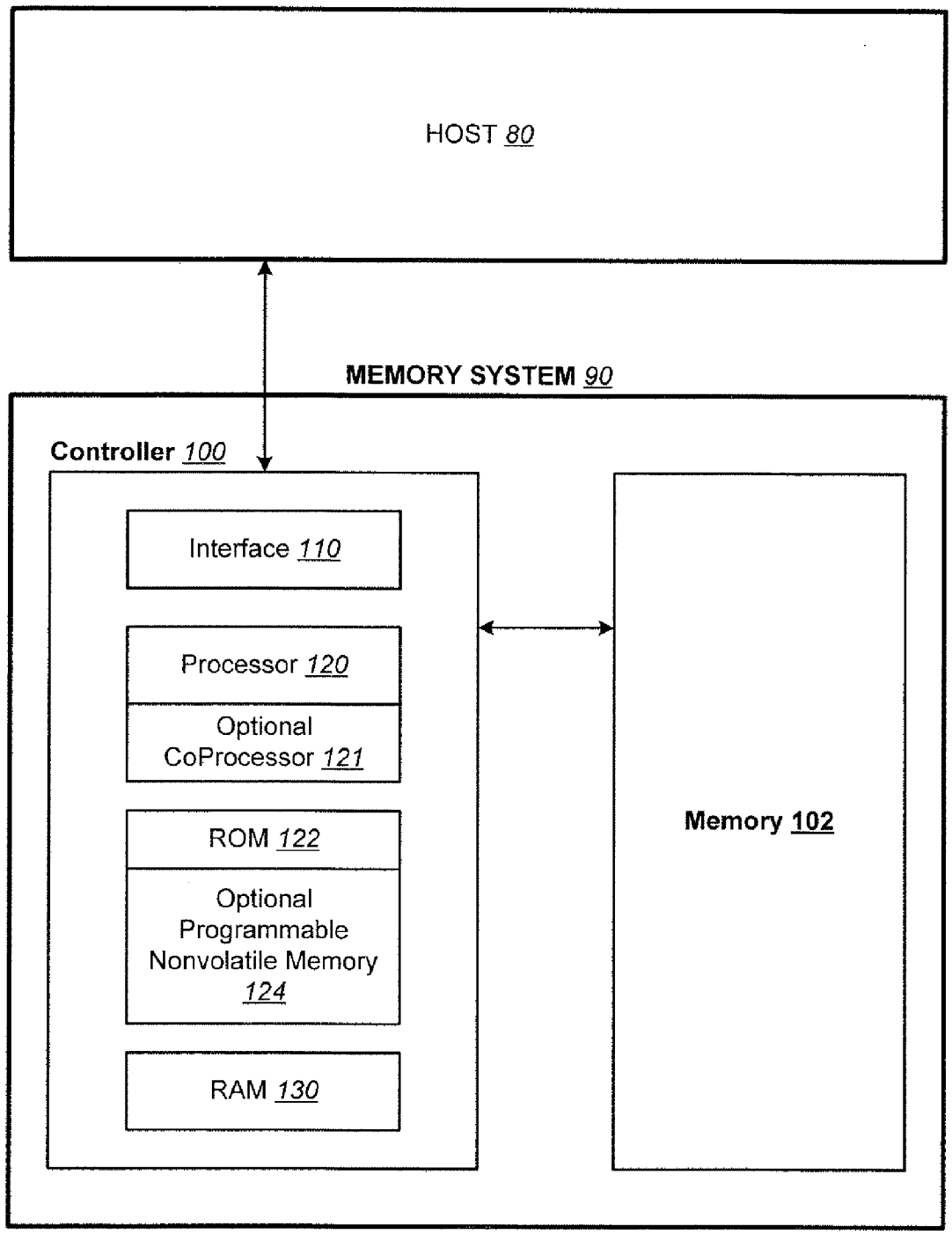
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
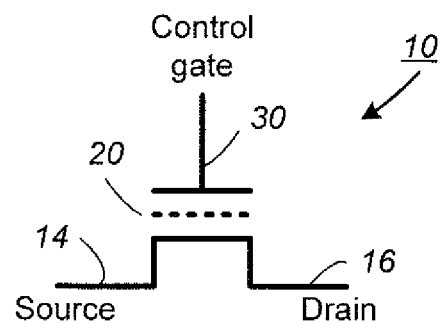
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
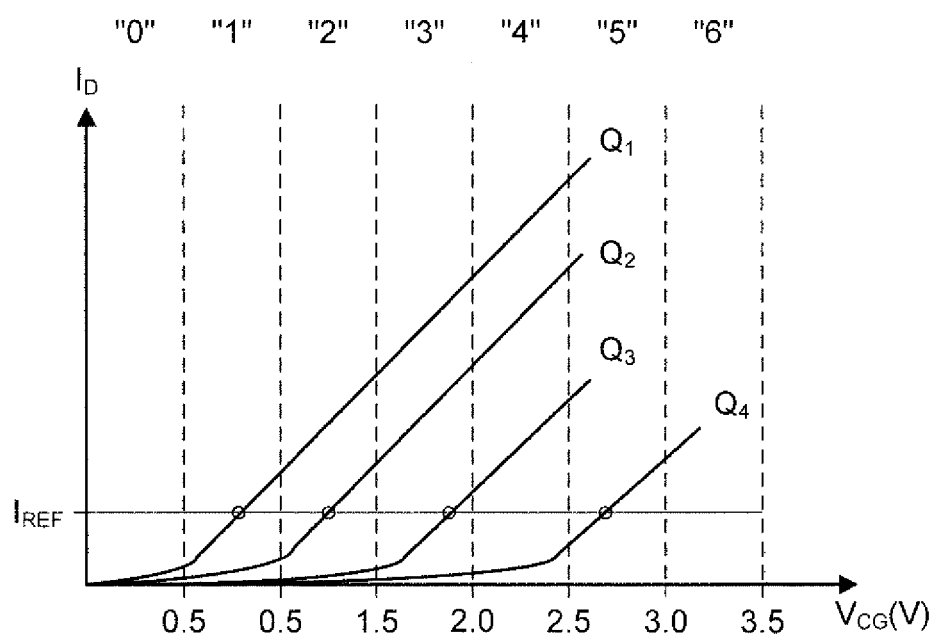
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. Seven possible memory states "0", "1", "2", "3", "4", "5", "6", respectively and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
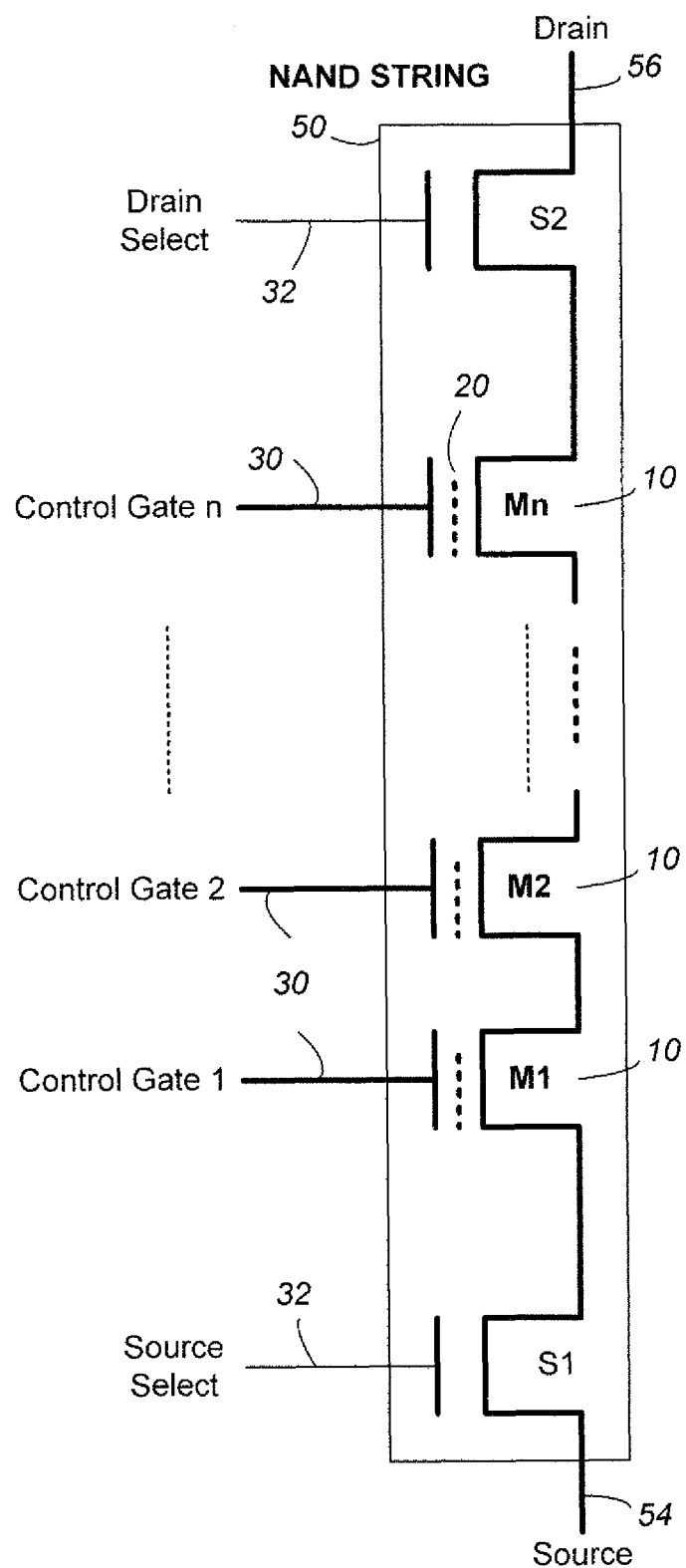
FIG. 4A illustrates schematically a string of memory cells organized into a NAND string.

FIG. 4A illustrates schematically a string of memory cells organized into a NAND string. A NAND string 50 comprises a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
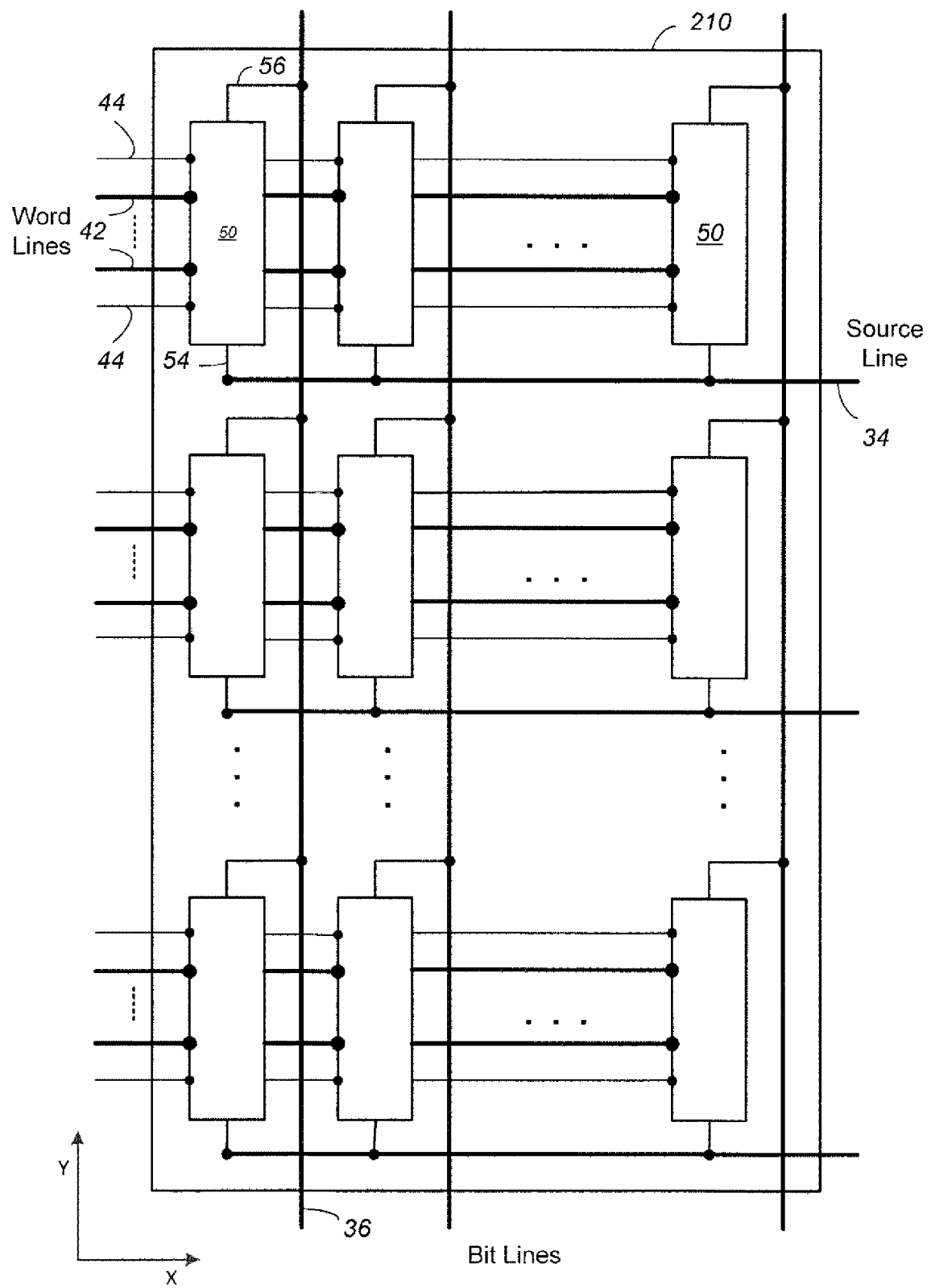
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
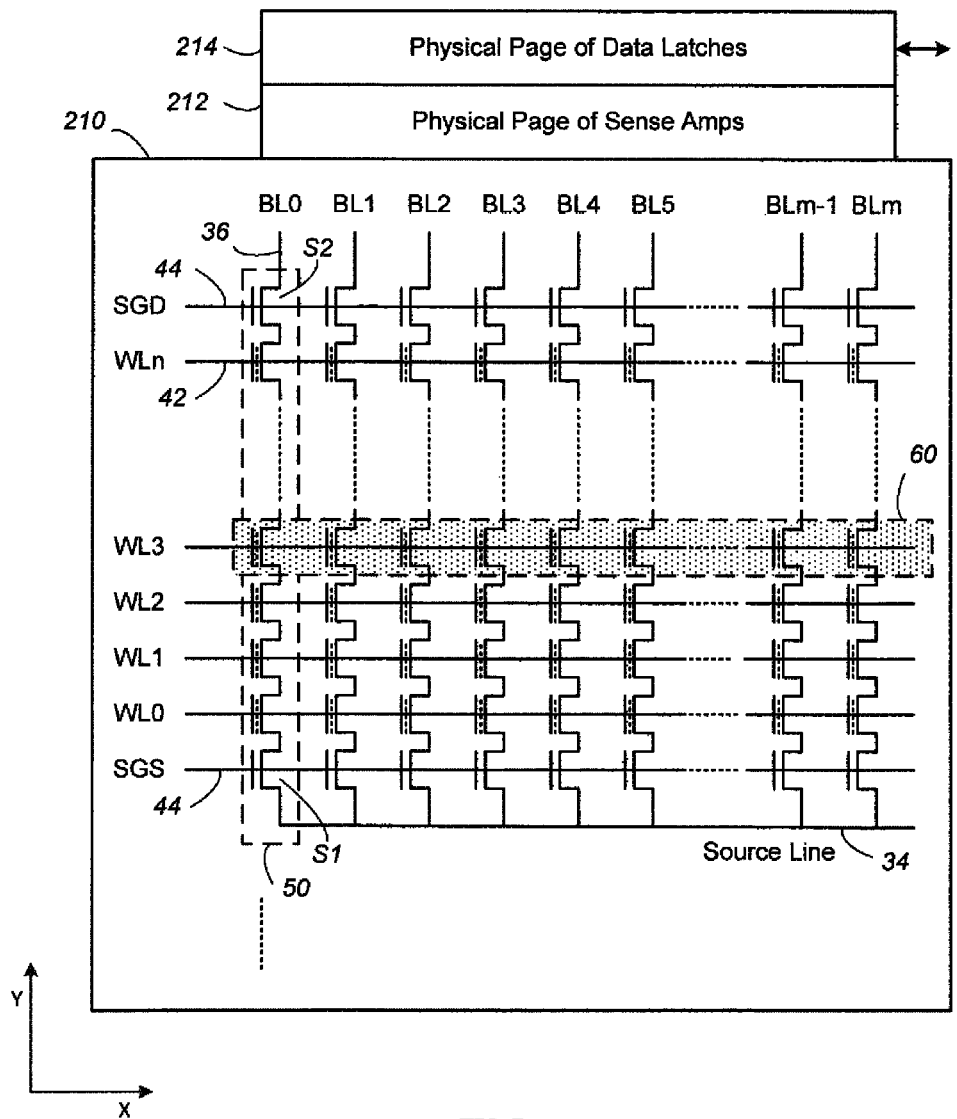
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
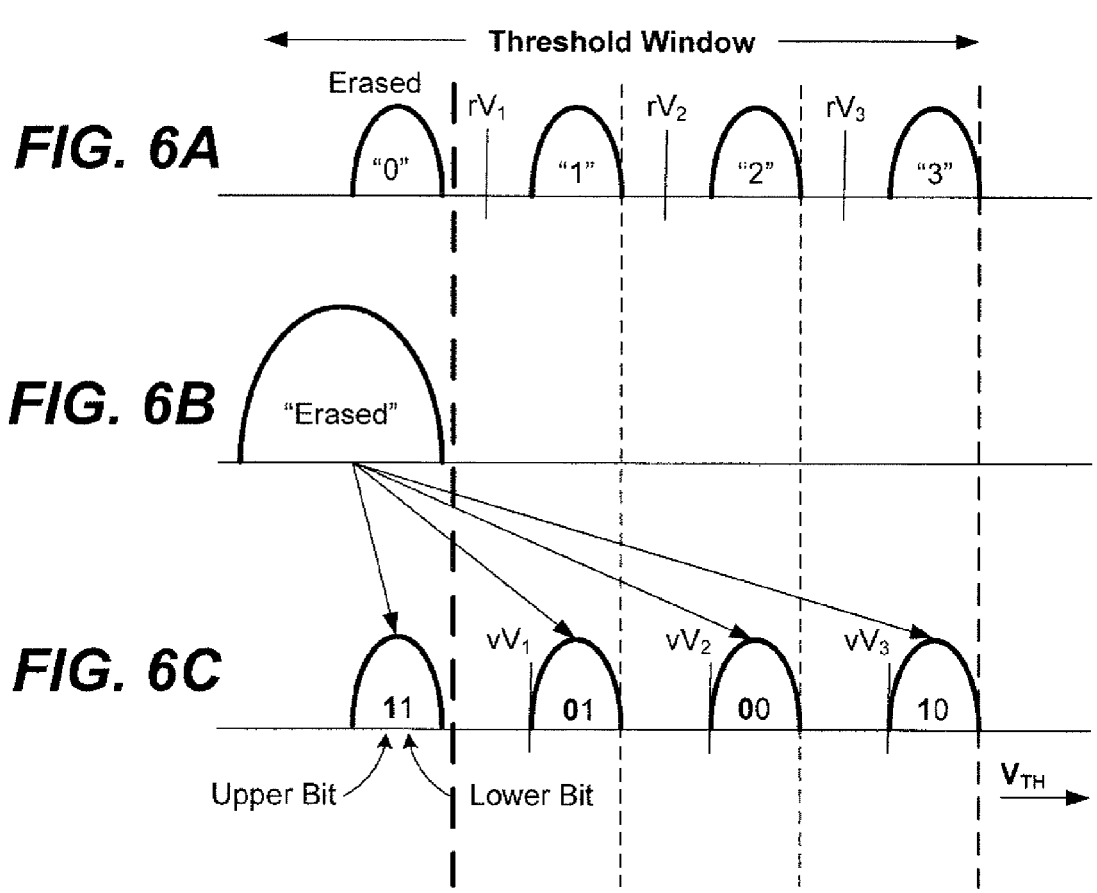
FIGS. 6A-6C illustrate an example of programming a population of 4-state memory cells.

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending up from the wafer surface. Various 3-D arrangements are possible. In one arrangement a NAND string is formed vertically with one end (e.g. source) at the wafer surface and the other end (e.g. drain) on top. In another arrangement a NAND string is fainted in a U-shape so that both ends of the NAND string are accessible on top, thus facilitating connections between such strings. Examples of such NAND strings and their formation are described in U.S. Patent Publication Number 2012/0220088.

Figure 7:
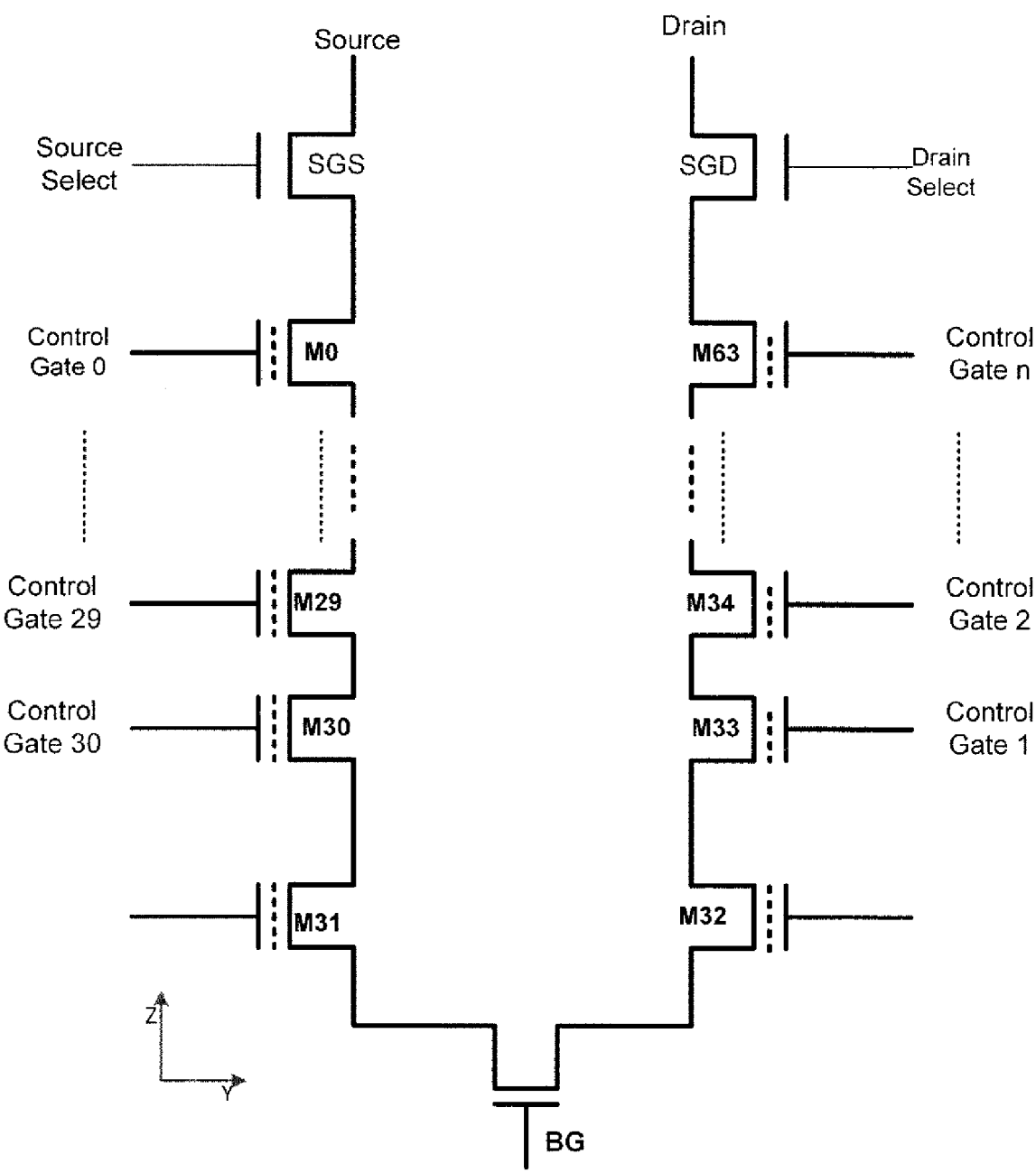
FIG. 7 shows an example of schematic of a 3-D NAND string.

FIG. 7 is a schematic showing an example of one such arrangement in which memory cells M0-M63 are formed along two sides of a U-shaped NAND string. (Not all 64 memory cells are shown for clarity of illustration, dashed lines indicate omitted memory cells.) Memory cells M0-M31 are formed on one side (left side of FIG. 7) with memory cells M32-M63 formed on the other side (right side of FIG. 7). Separate control gates are formed in each memory cell in a string where a word line couples to the cell's channel. Word lines extend horizontally to connect control gates of memory cells of other strings in the same row. Source and drain select transistors are provided at either end of the string to allow the string to be selectively connected to external connections for reading, writing, and erasing. At the bottom of the U-shaped string the two sides are connected. This connection may be formed by a controllable transistor, or gate ("back gate" or "BG"), as shown in FIG. 7 so that one side of the string can be isolated from the other. In some cases, one or more memory cells may be considered as dummy cells that do not store data because they are unreliable. For example, memory cells immediately adjacent to select transistors may be unreliable because of their location and may be dummy cells. Thus, rows of dummy cells may be formed, connected by dummy word lines.

Figure 8:
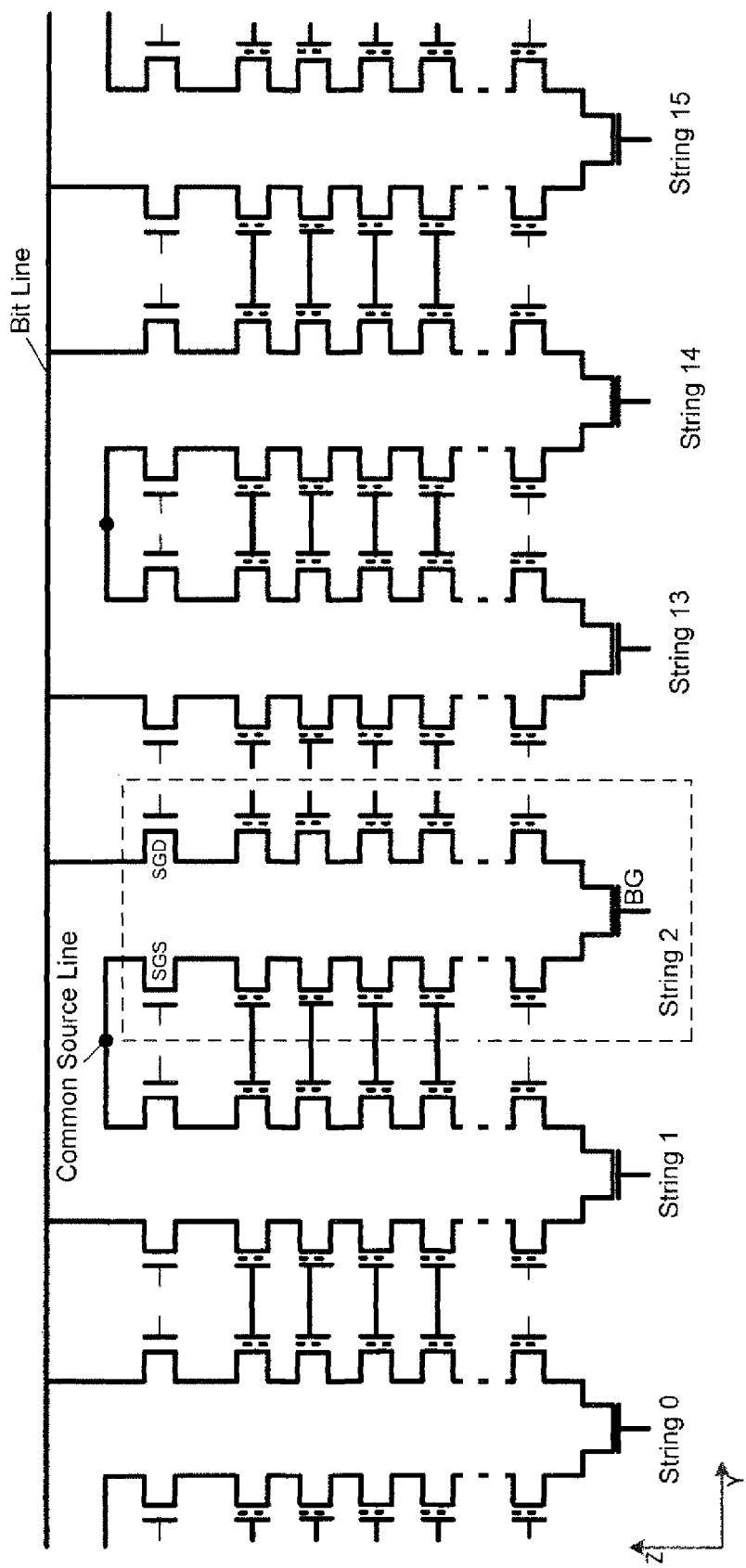
FIG. 8 shows an example of a schematic of a 3-D NAND array.

FIG. 8 is a schematic that shows the string of FIG. 7 (outlined by dashed lines) connected as string 2 of 16 strings that are connected to a common bit line in a block of a 3-D memory array (strings 3-12 are omitted from FIG. 8 for clearer illustration). One end of the string (the right end in FIG. 8) is connected to the bit line, while the other end of the string (the left end in FIG. 8) is connected to a common source line. The bit line extends in the y-direction as shown in FIG. 8 and connects the drains of strings 0-15 along the y-direction. (The x, y, and z axes follow the conventional scheme where the z axis is perpendicular to the surface of the substrate). The common source line extends in the direction perpendicular to the plane of FIG. 8 (i.e. it extends in the x-direction) and connects to other similar strings that are connected to other bit lines. Strings are arranged in an alternating pattern with source sides of neighboring strings adjacent each other and drain sides of neighboring strings adjacent to each other in the y-direction (i.e. drain to the left in string 1, then drain to the right in string 2, then drain to the left in string 3, etc.). This allows adjacent strings to share common source lines and share word lines.

Word lines extend in the x-direction. Word lines are shared between adjacent strings as shown, and may be connected so that word lines of different strings within a block are connected together (further described below). Select lines also extend in the x-direction but are not shared. They are separate so that they can be separately biased to individually select rows of strings.

It will be understood that the block consisting of strings 0-16 represented in FIG. 8 forms just a small portion of the overall memory array, with many more such blocks. Each block forms a unit of erase. In some cases, a portion of such a block may be separately erased while data remains elsewhere in the block. Such a sub-block erase scheme may, for example, allow half of a block to be erased while the other half of the block retains data. In either a block erase scheme, or a sub-block erase scheme, there is some minimum unit of erase in a NAND flash memory system (i.e. cells are not individually erasable) and data is managed accordingly with valid data in a particular block or sub-block being copied to another location prior to erasing the block or sub-block.

Figure 9A:
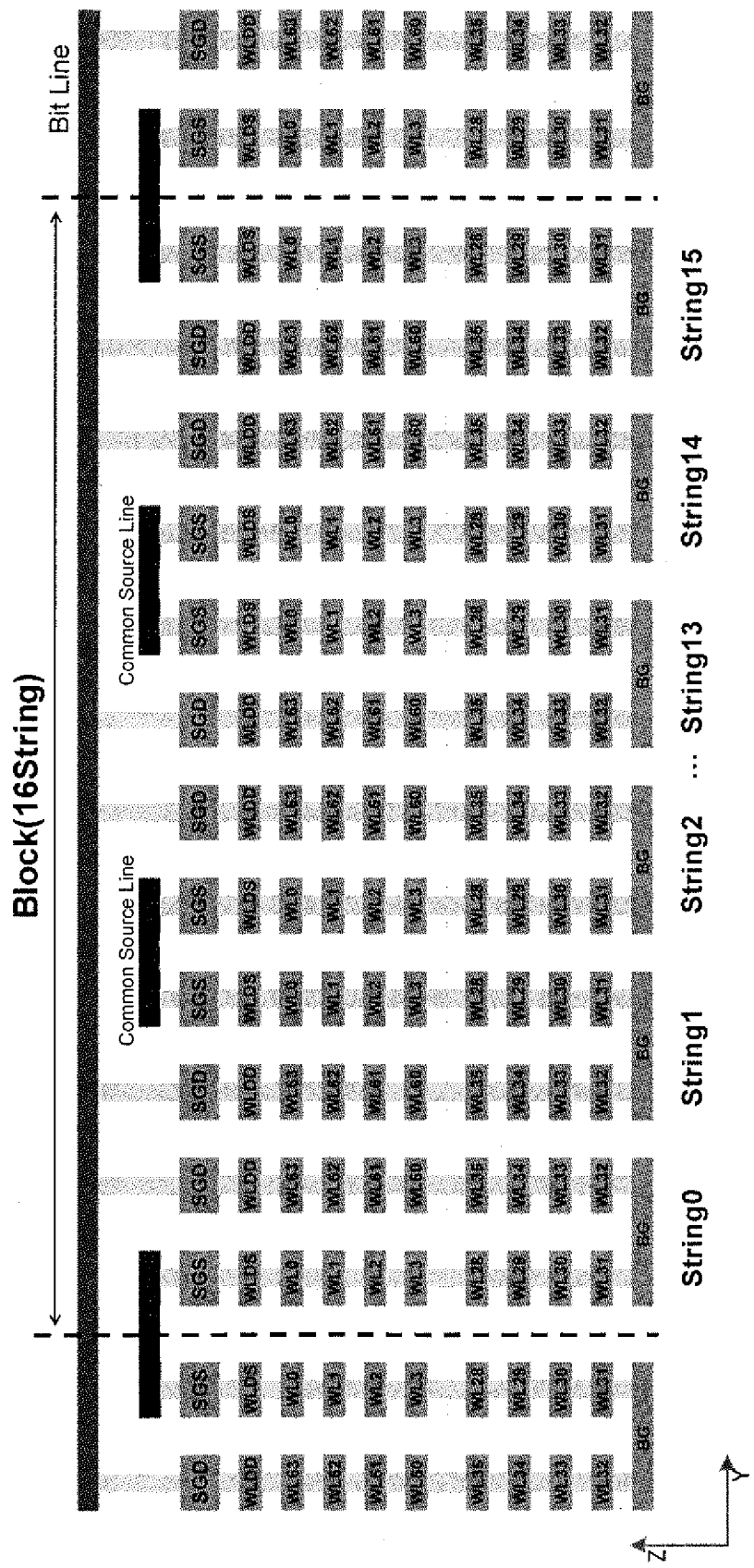
FIG. 9A shows an example of a physical implementation of a 3-D NAND array.

FIG. 9A shows a physical implementation of the block illustrated in FIG. 8. The bit line extends as a continuous conductor (e.g. metal line) in the y-direction with vertical connections formed between the bit line and drains of strings. Below the bit line, common source lines extend perpendicular to the cross section shown (i.e. extend in the x-direction) and connect sources of neighboring strings. Source select lines extend in the x-direction and form source select gates (SGS) where they intersect vertical columns. Drain select lines extend in the x-direction and form drain select gates (SGD) where they intersect vertical columns. Word lines WL0-WL63 extend in the x-direction and form control gates of memory cells where they intersect vertical columns. In one example, word lines are formed from conductive layers separated by dielectric layers, with channels of memory cells being formed in vertical holes ("memory holes") that extend through the conductive layers and dielectric layers.

Figure 9B:
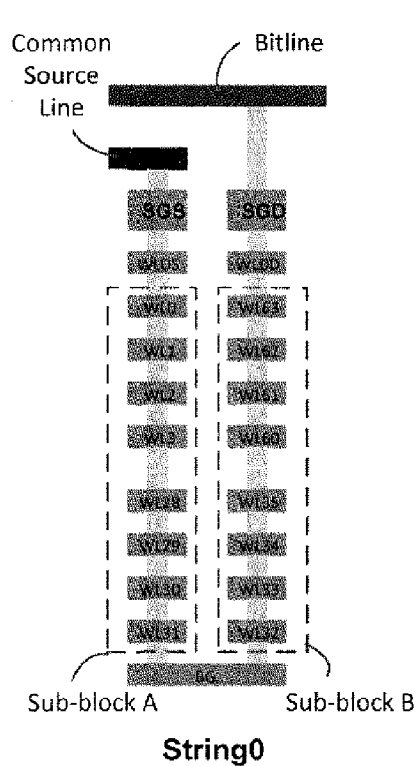
FIG. 9B shows an example of a NAND string divided between two sub-blocks.

FIG. 9B illustrates how one string of the block of FIG. 9A may be divided into two different sub-blocks (other strings in the block are similarly divided). In this case, half of the string (WL0-WL31) is in sub-block A, and the other half of the string (WL32-WL63) is in sub-block B. In other examples, sub-blocks may consist of smaller portions of a block so that a block may include more than two sub-blocks. Aspects of the present invention relate to both block erase and sub-block erase operations.

Erasing Unwritten Cells

In either planar NAND or 3D NAND, memory cells are programmed by adding charge to their charge storage elements (e.g. floating gates or portions of dielectric) and are erased by removing charge from their charge storage elements. Programming is applied to relatively small units of pages (e.g. a particular word line in a particular string) while erasing is applied to relatively large units of a block (e.g. all 64 word lines of 16 strings in example above) or sub-block (e.g. 32 of 62 word lines of 16 strings in example above). The difference in these units means that when an erase is performed in a particular block or sub-block, there may be significant unwritten space in the block or sub-block. In the above example of 16 strings with 64 word lines, there are 1024 memory cells along each bit line in the block. A block that is to be erased may be fully written (i.e. all 1024 word lines store data) or partially written (i.e. fewer than 1024 word lines store data). In some cases significant unwritten space in such blocks may affect an erase operation on the block. For example, erasing a block that has only one written word line (one word line out of 1024, or 0.1% written) may be significantly different to erasing a block that is fully written. A typical erase operation includes multiple cycles of applying erase pulses and performing erase verify steps which determine whether the block, or sub-block, has been successfully erased. Such cycles are repeated until an erase verify step indicates a successful erase. However, such erase verify steps may not be accurate where a block contains significant unwritten area. In particular, an erase verify step may return a false indication that the block is erased (all cells in erased condition with threshold voltages below a predetermined level) even though certain cells are under-erased (threshold voltages above the predetermined level).

Figure 10A:
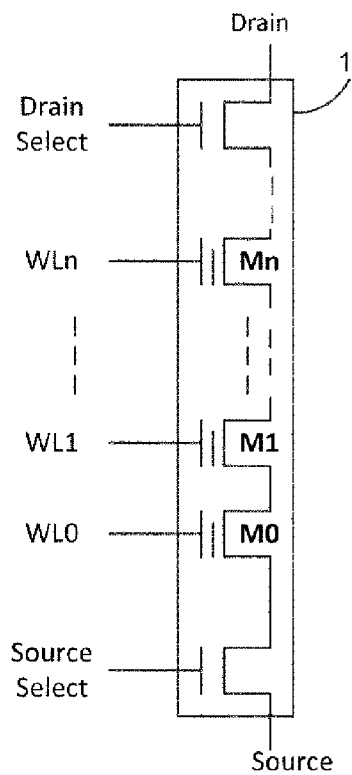
FIG. 10A is a schematic of a NAND string.
Figure 10B:
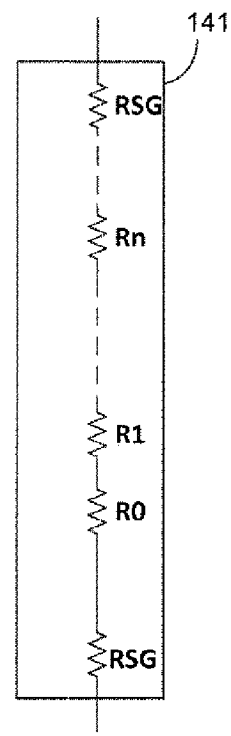
FIG. 10B is a schematic of a NAND string during an erase verify operation.

FIG. 10A shows a NAND string 141 that may be planar NAND or 3D NAND. FIG. 10B illustrates the same NAND string 141 schematically when performing an erase verify operation with each memory cell represented as a resistor (R0-Rn) and with select gates also represented as resistors (RSG). Erase verify typically evaluates the resistance of the channels of NAND strings by measuring current flow, discharge time, voltage difference, or some other measureable quantity when particular voltages are applied. When the measured quantity indicates that resistances of the channels are below a certain level, then the block is considered to be erased. However, when a significant number of memory cells are unwritten prior to erase, the distribution of resistance may be very uneven so that while the total resistance of the channel indicates that the cells are erased, certain cells (those that were written) may not be fully erased. Put differently, the low resistance of previously unwritten cells makes the total channel resistance lower than if those cells had been written and thus masks the higher resistance of under-erased cells. It will be understood that erase verify generally applies the same voltages to all cells and thus evaluates total channel resistance rather than attempting to evaluate the states of cells individually.

Figure 11:
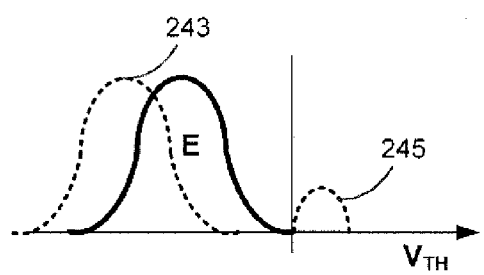
FIG. 11 shows distributions of threshold voltages of memory cells.

FIG. 11 illustrates how threshold voltages of cells in a block may be distributed when an erase verify step indicates that the block is erased. The nominal distribution for cells of an erased ("E") block is shown as a Gaussian distribution (shown by solid line). This distribution may be achieved when a fully written block is erased. In contrast, when the block has significant unwritten space prior to erase, cell threshold voltages may be as shown by the dotted line, with a main distribution 243 corresponding to memory cells that were unwritten, and another distribution 245 corresponding to memory cells that were written prior to erase. The previously written cells are under-erased and have threshold voltages outside the threshold voltage range assigned to erased cells (threshold voltages above zero in this example). While the net effect of either distribution on channel resistance may appear the same, and may both result in an erase verify step confirming that the block is erased, the consequences may be very different.

Figure 12:
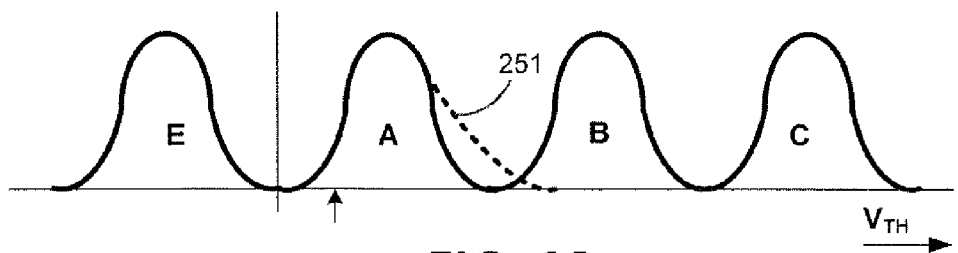
FIG. 12 shows distributions of threshold voltages after programming.

FIG. 12 shows how memory cells that are verified as erased when their threshold voltages remain high may affect later written data. FIG. 12 shows a four-state (two-bit) data storage scheme. Nominal distributions of memory cell threshold voltages are shown by solid lines. The dotted line 251 shows how memory cells programmed to state A may have their threshold voltages shifted because of their initial threshold voltages (i.e. threshold voltages prior to programming). Because the threshold voltages of these cells were higher than the nominal range for erased cells, applying normal programming conditions provides a high probability of overprogramming. This overprogramming may cause such cells to fall within the threshold voltage range for state B. If a sufficient number of such errors occurs, the errors may be uncorrectable by Error Correction Code (ECC) and may result in failure.

Dummy Data

One solution includes writing dummy data to fill unwritten space in a block, or sub-block, prior to erase. This step may be performed in preparation for erase so that all erase operations proceed with fully written blocks. Dummy data may be any suitable data generated simply to fill unwritten space. It may be generated by a memory controller or in the memory array. In some cases, a special form of program command may be used to program such data using a simplified programming operation without any verification step to ensure that the data is accurately written (there is no need for accuracy in writing such dummy data). A simplified programming operation in MLC memory may use a single programming step (i.e. no separate lower-page and upper-page programming).

Figure 13:
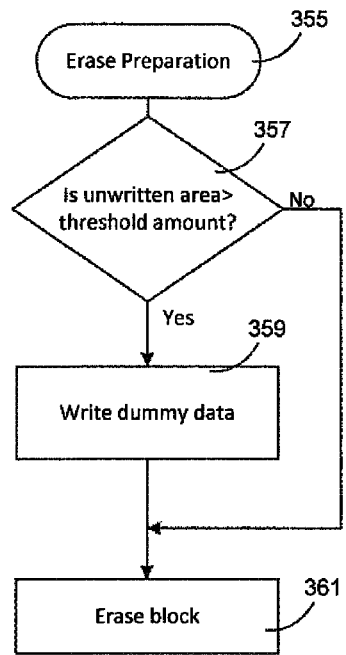
FIG. 13 illustrates a scheme for preparing a block for erase.

FIG. 13 shows one example of such an erase preparation scheme 355. Initially, a determination is made as to whether there is an unwritten area that is greater than some threshold amount 357. The threshold amount depends on the particular memory design and operating parameters used. In some memories, any unwritten space greater than zero may be considered significant. In others, only unwritten space greater than, for example, 50% or 80% may be considered significant. If the unwritten area exceeds the threshold amount then dummy data is written into the block 359 so that no unwritten space (or no significant unwritten space) remains. If the unwritten area is not greater than the threshold amount (e.g. block is full or substantially full) then the block is erased 361 without such writing of dummy data.

Figure 14:
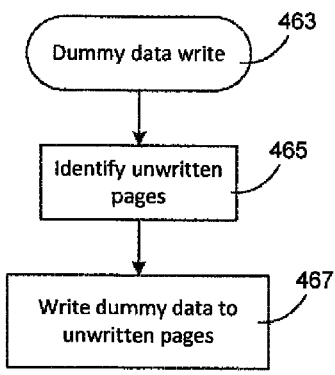
FIG. 14 illustrates a scheme that writes dummy data only to unwritten pages.

While a dummy data write may apply a simplified programming scheme to all memory cells (e.g. write a test pattern to all cells) it may be preferable to only write to unwritten cells. FIG. 14 shows an example of a dummy data write 463 in which unwritten pages are first identified 465. Then, dummy data is written to the unwritten pages 467. Pages that already contain data may remain as-before thus saving power by avoiding unnecessary writing.

While writing dummy data to memory cells in preparation for erase provides a more uniform block for erase, such a scheme increases wear on memory cells and may consume significant power and take a significant amount of time. Thus, this approach is not always desirable.

Adaptive Erase

One possible solution to the problem of under-erased cells is to simply set the erase verify criteria to ensure that erasing continues until all cells are truly erased under all conditions.

However, this would mean a deeper erase of memory cells in all cases, including cases where there is no unwritten space in the block and thus no need for such a deeper erase. Deeper erasing causes significant wear on memory cells and may shorten the life expectancy of a memory and is therefore undesirable.

According to an aspect of the present invention, an erase operation may be modified so that the erase operation is adapted to the condition of the erase block. In particular, where there is significant unwritten area in a block, or sub-block, an erase operation may be modified based on the amount of unwritten space in the block.

Figure 15:
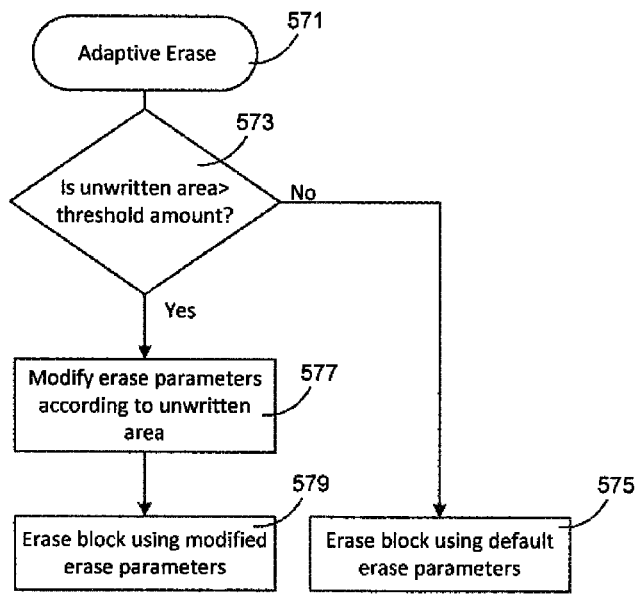
FIG. 15 illustrates an example of a scheme for adaptive erase.

FIG. 15 shows an example of an adaptive erase scheme 571. When a block is identified for erase a determination is made as to whether there is unwritten area in the block that is greater than a threshold amount 573. If the unwritten area is not greater than the threshold amount (e.g. block fully written, or substantially fully written) then the erase is performed using default parameters 575. If the unwritten area is greater than the threshold amount then erase parameters are modified according to the unwritten area 577 and the block is erased using these modified parameters 579.

Parameters that may be modified as part of an adaptive erase scheme include parameters used during erase verify such as voltages applied to word lines. Such parameters may be modified from their default values so, that erasing continues sufficiently to erase previously written memory cells (which are in danger of being under-erased). For example, more conductive channels may be required for a block to be considered erased if the block contains significant unwritten area. An adaptive scheme may have a range of modified parameter values that can be used according to the amount of unwritten area in the block. Such parameter values may be obtained from a lookup table or in some other manner. By modifying parameters in an adaptive manner on a block-by-block basis, memory cells are exposed to erase conditions sufficient to ensure that all cells are truly erased, but exposure to erase conditions is limited so that they do not suffer unnecessary over-erase.

In order to determine what erase parameters to use the amount of unwritten space in the block is obtained. Because programming of memory cells in a NAND memory array generally proceeds sequentially from word line to word line (e.g. start at WL0, then WL1, then WL2, and so on) the number of unwritten word lines (and thus the amount of unwritten space) may be determined from the location of the last write. In some cases, this may be determined from a write pointer maintained by a memory controller. In other cases, a search may be performed by a memory controller to determine where the last written data is located. For example, a binary search may be used to find the last written word line by performing reads of word lines in a binary search pattern. For example, in a 64 word line block, the search could read WL32 first. If WL32 is unwritten, then WL16 could be read. If WL16 is unwritten, then WL8 is read, and so on until the boundary between written and unwritten word lines is found. In this way, determining the amount of unwritten space in a block can be performed internally by the memory die and may not require any input from the memory controller. This may allow the determination and subsequent modification of erase parameters to be performed without the memory controller.

Adaptive Read

While the above examples refer to an erase verify step, erase verification is similar to reading data from a memory (both are operations to try to determine threshold voltages of memory cells). While aspects of the present invention relate to erase verification, other aspects of the present invention apply to read operations.

Figure 16:
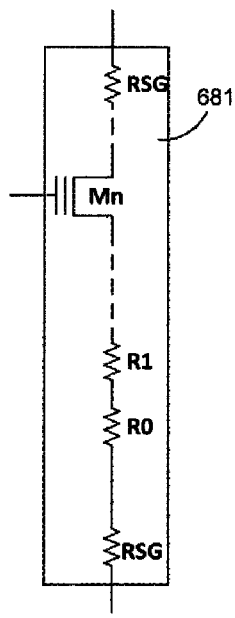
FIG. 16 is a schematic of a NAND string during a read operation.

FIG. 16 shows a NAND string 681 (such as NAND string of FIG. 10A) during a read of memory cell Mn. In this case, the control gate of memory cell Mn has a discrimination voltage applied while all other memory cells are turned on by applying Vpass to their control gates. In such a scheme, the state of memory cell Mn is again inferred from the overall channel resistance. However, where significant unwritten space remains, the unwritten cells in the string may lower channel resistance significantly so that channel resistance appears lower than it would be if those cells were written. The apparent threshold voltage of memory cell Mn inferred from such a channel may be shifted from its actual threshold voltage. If such a shift is significant, it may cause the memory state of the cell to be misread thus causing an error.

Figure 17:
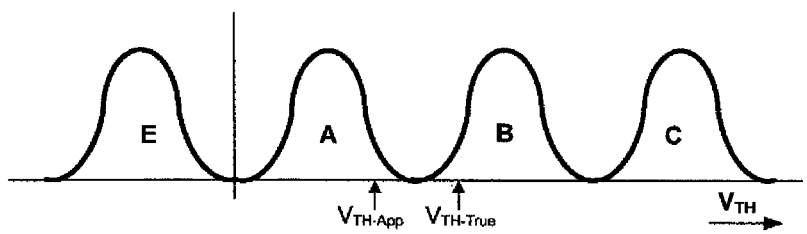
FIG. 17 illustrates a shift in apparent threshold voltage.

FIG. 17 illustrates how such a shift in threshold voltage may occur. A memory cell may be programmed to memory state B. This means that it has a true threshold voltage that is within the range assigned to memory state B as indicated by $V_{TH\text{-}True}$. However, if the cell is read when a significant number of cells in the same NAND string are unwritten, its apparent threshold voltage may be shifted down as indicated by $V_{TH\text{-}App}$. This corresponds to memory state A. Thus, the cell would be misread as being in memory state A and erroneous data would be output.

In general, small numbers of such errors would be corrected by ECC. In some cases, large numbers of such errors would result in data that is uncorrectable by ECC and one or more additional read operations might be performed using different read parameters until the data passes ECC. However, simply adjusting read parameters until data passes ECC may take significant time if it is done in some random fashion. According to an aspect of the present invention, such adjustment of read parameters may be performed in a manner that is based on the amount of unwritten area in the block. In particular, if there is significant unwritten space then it is likely that apparent threshold voltages are shifted down from the true threshold voltages as shown in FIG. 17. Accordingly, discrimination voltages used to read such cells may be adjusted down in order to compensate. Alternatively, or in addition, Vpass may be reduced to compensate.

Figure 18:
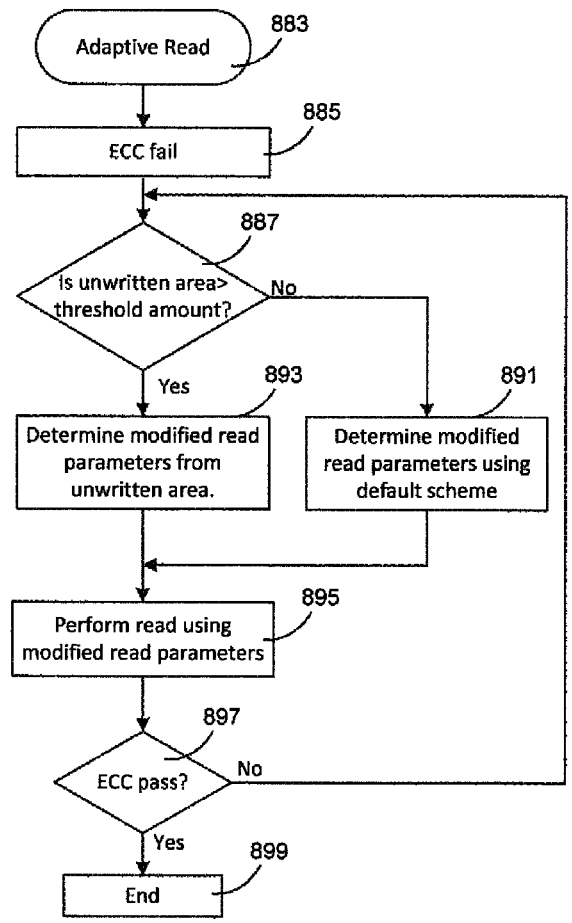
FIG. 18 illustrates a scheme for adaptive reading.

FIG. 18 shows a scheme for such an adaptive read 883. After an initial read is performed using default parameters and an ECC fail occurs 885, a determination is made as to whether the unwritten area is greater than a threshold amount 887. If the unwritten area is not greater than the threshold amount (i.e. the block is full, or substantially full) then unwritten cells are not likely to be the cause of the read errors and a default adjustment scheme may be used 891 (e.g. discrimination voltage may be varied in increments above and below default value). If the unwritten area is greater than the threshold amount then unwritten cells are likely to be the cause of the read errors and modified read parameters may be determined according to the amount of unwritten area 893. For example, a lookup table may provide different sets of read parameters to use depending on the amount of unwritten area. As before, unwritten area may be identified in a number of ways. Reading is performed using the modified read parameters 895. If the data is correctable by ECC 897 then the read is complete 899 and the data is output. If the data is not correctable by ECC then the process may be repeated.

It will be understood that examples above refer to particular hardware examples such as 3D NAND with U-shaped strings but that aspects of the present invention are not limited to any particular hardware. Aspects of the present invention may apply to memories storing one bit per cell, or more than one bit per cell (MLC).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of performing an adaptive erase verification during erase of a block in a 3-D NAND memory, comprising:
    determining an amount of unwritten space remaining in the block in the 3-D NAND memory;
    if the amount of unwritten space is less than a predetermined amount then performing erase verification using a default set of verification parameters; and
    if the amount of unwritten space exceeds the predetermined amount then performing erase verification using a modified set of verification parameters that is different to the default set of erase parameters.

2. The method of claim 1 wherein the modified set of verification parameters is selected from a plurality of sets of modified verification parameters according to the amount of unwritten space.

3. The method of claim 1 wherein the amount of unwritten space is determined from a binary search of memory cells of the block.

4. The method of claim 3 wherein the binary search is performed by logic circuits that are on the same integrated circuit chip as the NAND memory.

5. The method of claim 1 wherein the 3-D NAND memory is formed of two or more layers of memory cells disposed above a substrate surface.

6. The method of claim 5 wherein the 3-D NAND memory includes vertical NAND strings with a first end at the substrate surface and a second end on top.

7. The method of claim 5 wherein the 3-D NAND memory includes U-shaped NAND strings.

8. The method of claim 1 wherein the block includes two or more vertical NAND strings connected to a common bit line.

9. A method of performing an adaptive erase verification during erase of a block in a NAND memory, comprising:
    determining an amount of unwritten space remaining in the block;
    if the amount of unwritten space is less than a predetermined amount then performing erase verification using a default set of verification parameters;
    if the amount of unwritten space exceeds the predetermined amount then performing erase verification using a modified set of verification parameters that is different to the default set of erase parameters; and
    wherein the amount of unwritten space is determined from a write pointer.

10. The method of claim 9 wherein the write pointer is maintained by a memory controller that is connected to the NAND memory.

* * * * *